US010345792B2

(12) United States Patent
Yamazaki et al.

(10) Patent No.: US 10,345,792 B2
(45) Date of Patent: Jul. 9, 2019

(54) GROUP DETERMINATION METHOD AND GROUP DETERMINATION APPARATUS (71) Applicant: Panasonic Intellectual Property Management Co., Ltd., Osaka (JP)

(72) Inventors: Takuya Yamazaki, Fukuoka (JP); Atsushi Nakazono, Kanagawa (JP); Hiroshi Ando, Kanagawa (JP); Kazuyoshi Harada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 26 days.

(21) Appl. No.: 15/865,526

(22) Filed: Jan. 9, 2018

(65) Prior Publication Data

US 2018/0203436 A1 Jul. 19, 2018

(30) Foreign Application Priority Data

Jan. 17, 2017 (JP) .................................. 2017-005556

(51) Int. Cl.
*G05B 19/418* (2006.01)

(52) U.S. Cl.
CPC ..... *G05B 19/4183* (2013.01); *G05B 19/41865* (2013.01); *G05B 2219/32361* (2013.01); *Y02P 90/02* (2015.11); *Y02P 90/04* (2015.11)

(58) Field of Classification Search
None
See application file for complete search history.

(56) References Cited

U.S. PATENT DOCUMENTS

2017/0061365 A1* 3/2017 Nonoyama .......... G05B 19/418
2019/0049935 A1* 2/2019 Ikeda ............... G05B 19/41805

FOREIGN PATENT DOCUMENTS

JP 3830642 B2 10/2006

* cited by examiner

*Primary Examiner* — Sean Shechtman
(74) *Attorney, Agent, or Firm* — Pearne & Gordon LLP (57) ABSTRACT In two component mounting lines or more each including the plurality of the component mounters, a set-up changing work time, necessary for executing set-up changing work in the two component mounting lines or more based on the number of workers assigned for production in the two component mounting lines or more in each time zone, and the number of workers necessary for the set-up changing work necessary when the mounting board is changed in the two component mounting lines or more, is calculated; and a production completion time, which includes a set-up changing work time and at which the production of all the mounting boards that are the production targets is completed, is calculated; and a group is determined so that the production completion time is shortened within a predetermined time period in the two component mounting lines or more.

4 Claims, 9 Drawing Sheets

GROUP DETERMINATION METHOD AND GROUP DETERMINATION APPARATUS

BACKGROUND

1. Technical Field

The present disclosure relates to a group determination method and a group determination apparatus for determining a group of mounting boards which are common among a plurality of types of the mounting boards as production targets in a component arrangement of a component mounter.

2. Description of the Related Art

In a component mounting line which is configured by connecting a plurality of component mounters mounting components on boards, a plurality of types of the mounting boards are produced in order. When the plurality of types of the mounting boards are produced in the component mounting line, a so-called common arrangement, in which a component supplier that supplies components necessary for the production of the plurality of types of the mounting boards are disposed in advance in a component supply carriage capable of attaching and detaching to and from the component mounter, is performed. It is possible to continue the production without changing the component supplier on the component supply carriage by causing the arrangement of the component supplier to be the common arrangement when the mounting board that is the production target is changed (for example, see Japanese Patent No. 3830642).

In Japanese Patent No. 3830642, in the determination of the group of the mounting board to be produced in the same common arrangement, the number of the set-ups for replacing the component supplier is reduced and the group of the mounting board and the common arrangement are determined so as to shorten a set-up work time.

SUMMARY

A group determination method of the disclosure for dividing a plurality of types of mounting boards that are production targets into a plurality of groups in which an arrangement of component suppliers is common in component mounters, in two component mounting lines or more each including a plurality of the component mounters capable of attaching and detaching a component supply carriage, which can dispose a plurality of the component suppliers for supplying components, the method including a set-up changing work time calculation step of calculating a set-up changing work time necessary for executing set-up changing work for changing the mounting boards that are the production targets in the component mounting lines, based on the number of workers assigned for production in the two component mounting lines or more in each time zone, and the number of workers necessary for the set-up changing work necessary when the mounting board is changed in each of the two component mounting lines or more in the each time zone; and a production completion time calculation step of calculating a production completion time which includes the set-up changing work time and at which the production of all the mounting boards that are the production targets is completed. The groups are determined so that the production completion time is shortened within a predetermined time period in the two component mounting lines or more.

A group determination apparatus of the disclosure, which divides a plurality of types of mounting boards that are production targets into a plurality of groups in which an arrangement of component supplier is common in component mounters, in two component mounting lines or more each including a plurality of the component mounters capable of attaching and detaching a component supply carriage, which can dispose a plurality of the component suppliers for supplying components, the apparatus including a set-up changing work time calculator which calculates a set-up changing work time necessary for executing set-up changing work for changing the mounting boards that are the production targets in the component mounting lines, based on the number of workers assigned for production in the two component mounting lines or more in each time zone, and the number of workers necessary for the set-up changing work necessary when the mounting board is changed in each of the two component mounting lines or more in the each time zone; a production completion time calculator which calculates a production completion time which includes the set-up changing work time and at which the production of all the mounting boards that are the production targets is completed; and a group determination unit which determines the groups so that the production completion time is shortened within a predetermined time period in the two component mounting lines or more.

According to the disclosure, it is possible to determine a group in which the component arrangement capable of obtaining higher productivity than that in the related art in an entire floor is common.

DETAILED DESCRIPTIONS

Prior to describing embodiments, a problem in the related art will be briefly described. In the related art including Japanese Patent No. 3830642, the production of the mounting board and the set-up work are executed according to the common arrangement of the group of the mounting board which is determined so as to reduce the number of the set-ups or the set-up work time. However, in a case where there are a plurality of component mounting lines on the same floor, if the set-up work occurs simultaneously on the plurality of the component mounting lines, the number of workers performing the set-up work becomes short and, as a result, a production time may become longer. Therefore, there is a room for further improvement.

In view of the above, an object of the disclosure is to provide a group determination method and a group determination apparatus for determining a group of a common arrangement, which can obtain higher productivity than that of the related art on the entire floor.

Figure 3:
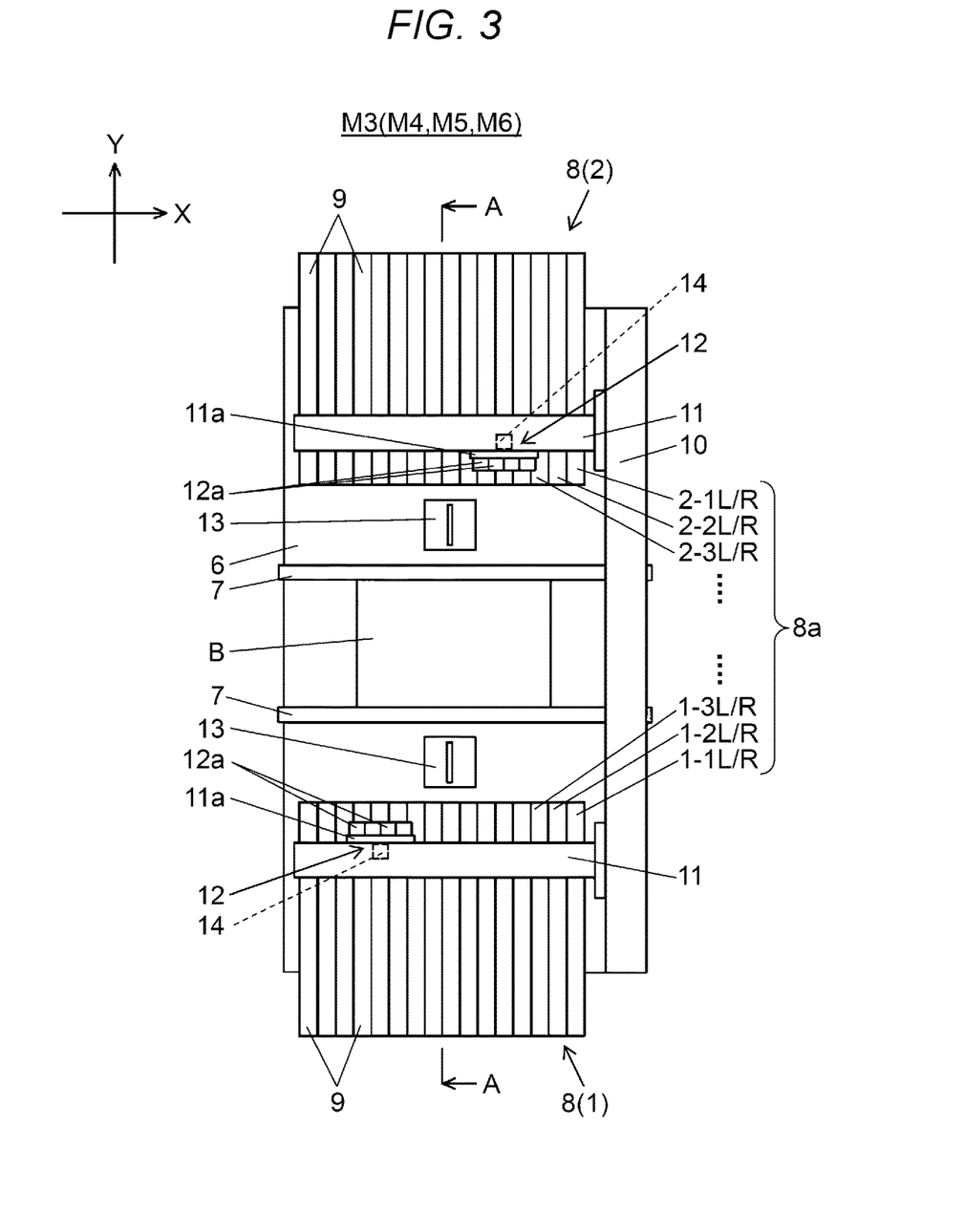
FIG. 3 is a plan view of a component mounter included in the component mounting system of an embodiment of the disclosure.
Figure 4:
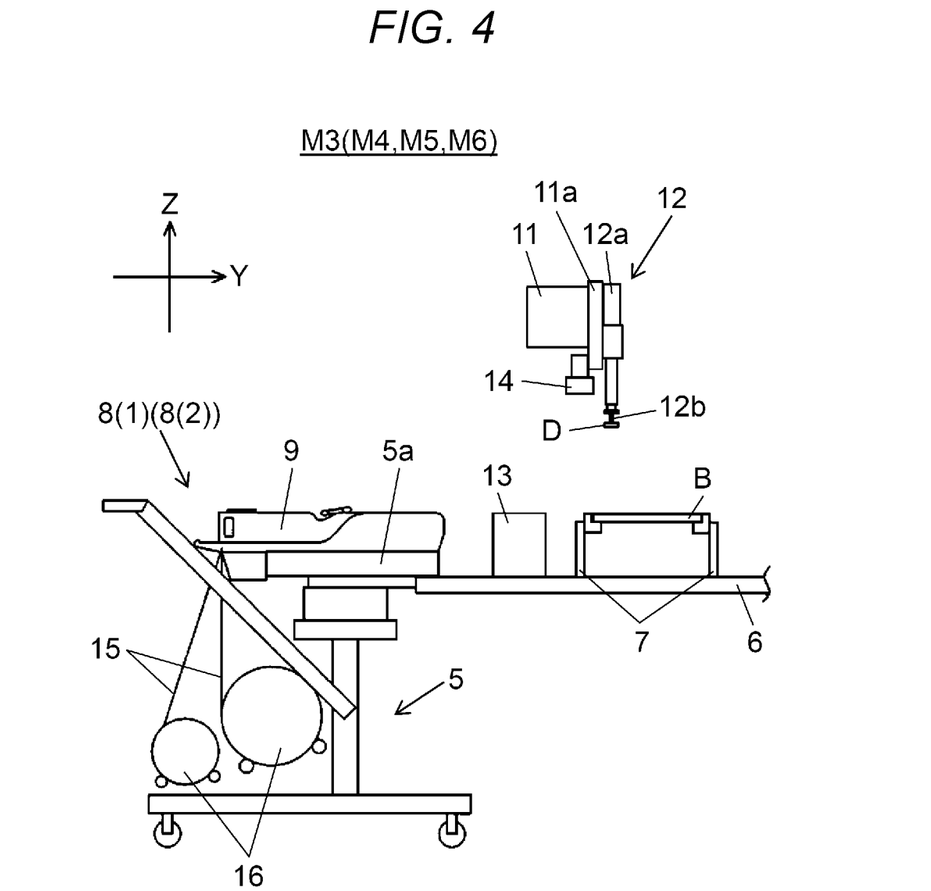
FIG. 4 is an explanatory view of the component mounter included in the component mounting system of an embodiment of the disclosure.

Hereinafter, an embodiment will be described in detail with reference to the drawings. Configurations, shapes, and the like described below are examples for explanation, and can be appropriately changed in accordance with the specifications of the component mounting system, the component mounting line, and a component mounter. In the following description, the same reference numerals are given to corresponding elements in all drawings and redundant explanations will be omitted. In FIG. 3 and in a part to be described later, as two axial directions orthogonal to each other in a horizontal plane, an X direction (rightward and leftward direction in FIG. 3) indicates a board transport direction and a Y direction (upward and downward direction in FIG. 3) indicates a direction orthogonal to the board transport direction. In FIG. 4, a Z direction (upward and downward direction in FIG. 4) indicates a height direction orthogonal to the horizontal plane. The Z direction is the upward and downward direction or the orthogonal direction in a case where the component mounter is provided on the horizontal plane.

Figure 1:
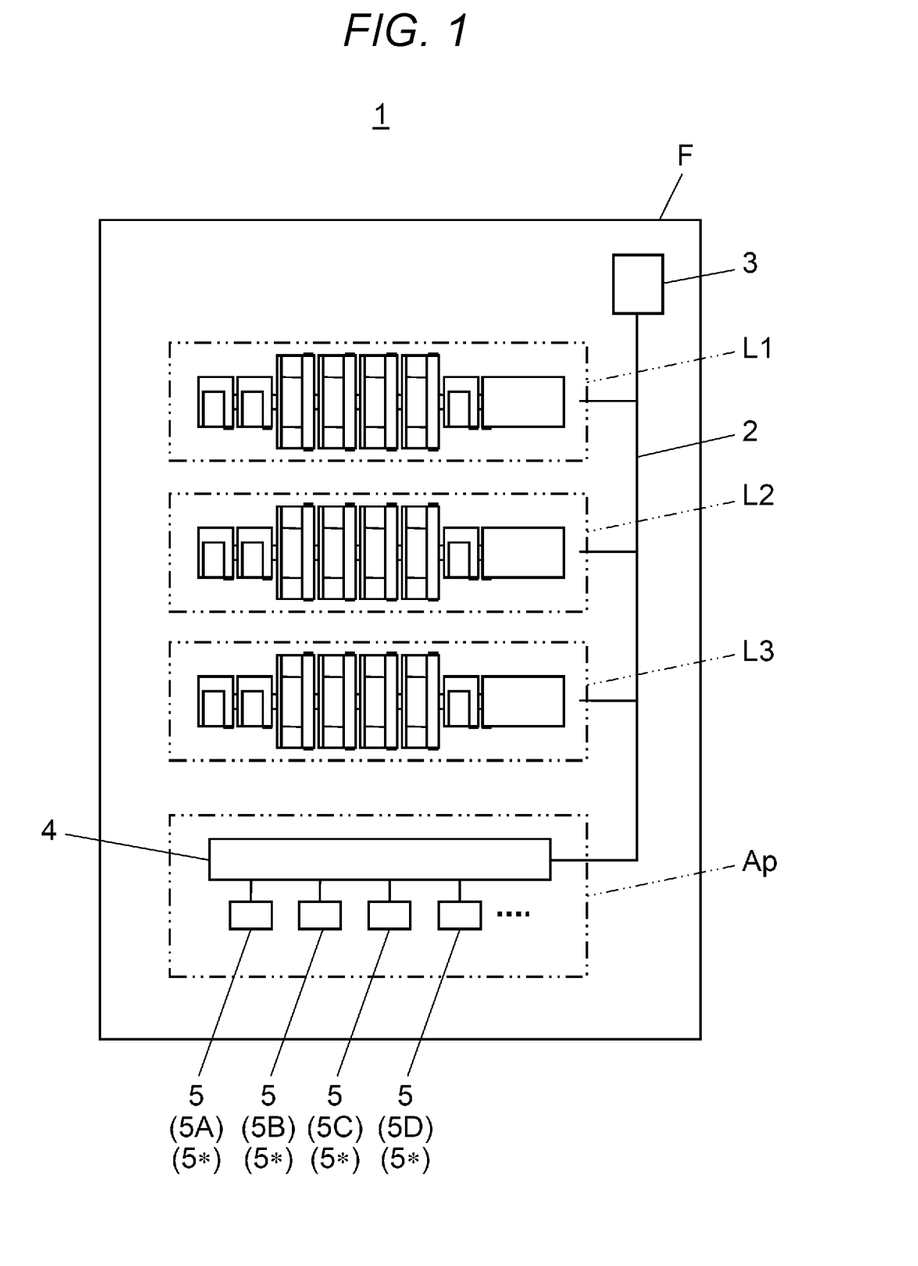
FIG. 1 is an explanatory view of a configuration of a component mounting system of an embodiment of the disclosure.

First, a configuration of component mounting system 1 will be described with reference to FIG. 1. Component mounting system 1 has a configuration in which three component mounting lines L1 to L3 disposed on floor F are connected by communication network 2 and which is managed by management computer 3. Each of component mounting lines L1 to L3 is formed by connecting a plurality of component mounting devices including the component mounters which are described later and has a function of producing a mounting board where a component is mounted on a board. That is, component mounting system 1 has component mounting lines L1 to L3 formed by connecting the plurality of the component mounting devices. Component mounting lines L1 to L3 included in component mounting system 1 is not limited to three and may be two, or four or more. That is, component mounting system 1 includes two component mounting lines L1 to L3 or more.

Set-up work support device 4 is disposed in external set-up area Ap provided on floor F. Set-up work support device 4 is connected to management computer 3 via communication network 2. Set-up work support device 4 is connected to a plurality of replacement component supply carriages 5 (here, four component supply carriages 5A, 5B, 5C, and 5D) which are targets of the set-up work. Hereinafter, replacement component supply carriage 5 is referred to as "spare carriage 5*". A plurality of tape feeders 9 (see FIG. 4) for supplying components by a worker in charge of the set-up work are installed on spare carriage 5* (component supply carriages 5) connected to set-up work support device 4. If tape feeders 9 are installed on spare carriage 5*, power is supplied to tape feeder 9 by set-up work support device 4 via spare carriage 5* and a feeder controller (not illustrated) built in tape feeder 9 is in a communicable state with management computer 3. Therefore, a status of the set-up work such as an installing status of tape feeder 9 on spare carriage 5* and a supply status of carrier tape 15 (see FIG. 4) holding component D to tape feeder 9 can be acquired in management computer 3.

As described above, in spare carriage 5* connected to set-up work support device 4, it is possible to perform the set-up work without stopping the production of the mounting board in component mounting lines L1 to L3. That is, set-up work support device 4 supports the set-up work (hereinafter, referred to as an "external set-up work") which is executed without stopping the production of the mounting board in component mounting lines L1 to L3. Spare carriage 5* (replacement component supply carriage 5) in which the external set-up work is completed is replaced with component supply carriage 5 of a replacement target installed on the component mounter in the set-up work (hereinafter, referred to as an "internal set-up work") which stops and executes the production of the mounting board in component mounting lines L1 to L3.

Figure 2:
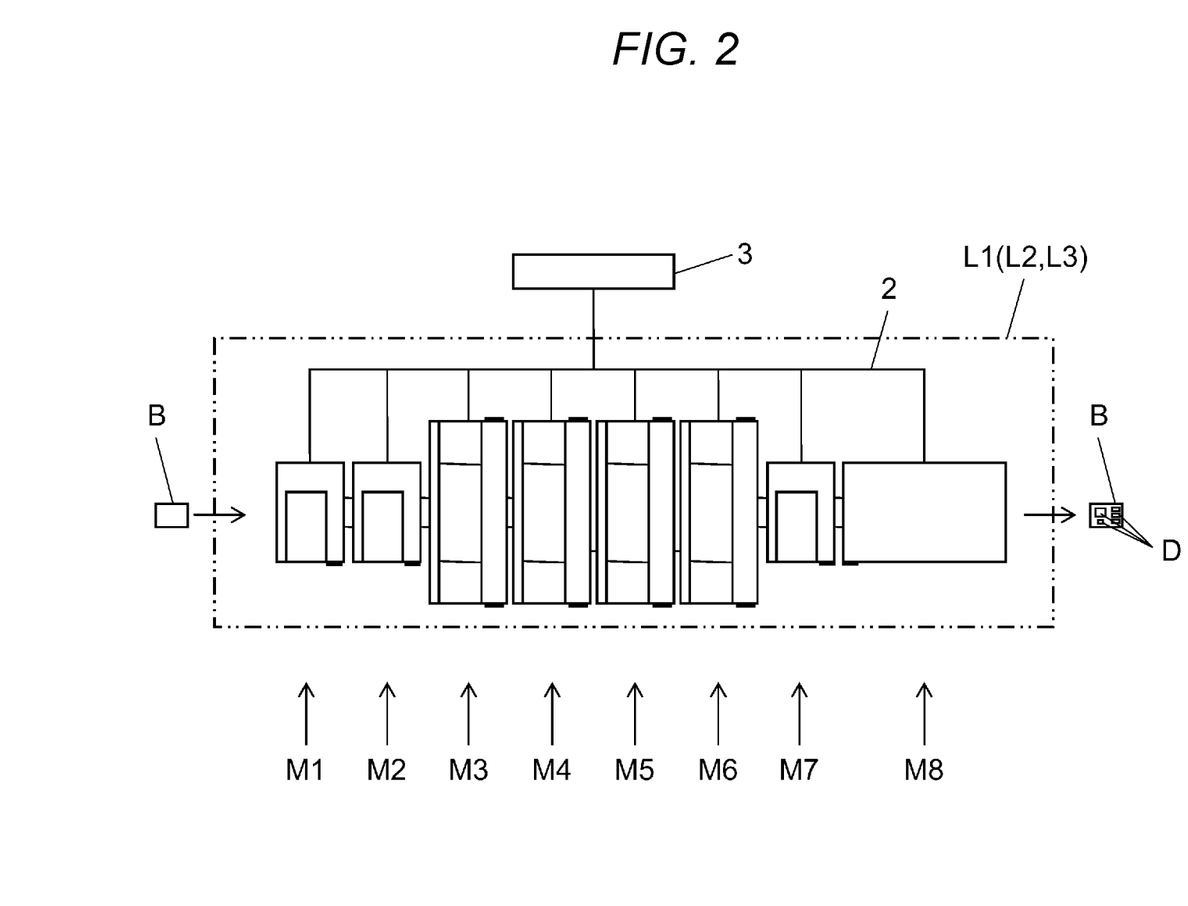
FIG. 2 is an explanatory view of a configuration of a component mounting line included in the component mounting system of an embodiment of the disclosure.

Next, a detailed configuration of component mounting lines L1 to L3 will be described with reference to FIG. 2. Component mounting lines L1 to L3 have the same configuration and hereinafter, component mounting line L1 will be described. Component mounting line L1 is formed by connecting in series the component mounting devices such as solder printing apparatus M1, printing inspection apparatus M2, component mounters M3 to M6, mounting inspection apparatus M7, and reflow apparatus M8 from an upstream side (left side of a paper surface) to a downstream side (right side of the paper surface) in the board transport direction.

Solder printing apparatus M1, printing inspection apparatus M2, component mounters M3 to M6, mounting inspection apparatus M7, and reflow apparatus M8 are connected to management computer 3 via communication network 2. Solder printing apparatus M1 executes solder printing work of printing a solder on board B, which is carried in from the upstream side by a solder printing work unit, via a mask. Printing inspection apparatus M2 executes printing inspection work for inspecting a state of a printed solder on board B by a printing inspection work unit including a solder inspection camera.

Component mounters M3 to M6 execute component mounting work for mounting component D on board B by a component mounting work unit. In component mounting line L1, the number of component mounters M3 to M6 is not limited to four and component mounters M3 to M6 may be one to three, or may be five or more. Mounting inspection apparatus M7 executes mounting inspection work for inspecting a state of component D mounted on board B by a mounting inspection work unit including a component inspection camera. Reflow apparatus M8 executes a board heating work in which board B carried in the apparatus is heated by a board heater, the solder on board B is hardened, and an electrode portion of board B and component D are joined.

Next, a configuration of component mounters M3 to M6 will be described with reference to FIGS. 3 and 4. Component mounters M3 to M6 have the same configuration and here, component mounter M3 will be described. FIG. 4 partially illustrates a cross section A-A in FIG. 3. Component mounter M3 has a function of mounting component D on board B. In FIG. 3, board transport mechanism 7 is disposed at a center of base 6 in the X direction. Board transport mechanism 7 transports board B carried in from the upstream side and positions board B at a position at which the component mounting work is executed. Component supplying units 8 (1) and 8(2) are provided on both sides of board transport mechanism 7. A plurality of part feeders for supplying component D are juxtaposed and installed on component supplying units 8 (1) and 8(2). Feeder addresses 8a for specifying the installing positions of the part feeders are set in component supplying units 8 (1) and 8(2).

In the example illustrated in the embodiment, as feeder address 8a in component supplying unit 8 (1), 1-1L/R, 1-2L/R, 1-3L/R . . . are set from a downstream side (right side in FIG. 3) to an upstream side.

It is possible to individually specify the part feeder installed on component mounter M3 by designating feeder addresses 8a.

Similarly, as feeder address 8a in component supplying unit 8 (2), 2-1L/R, 2-2L/R, 2-3L/R . . . are set from the downstream side to the upstream side. The order setting method in feeder address 8a is arbitrary and the address order of component supplying units 8 (1) and 8(2) may be reversely set.

Here, an example, in which tape feeder 9 having a function of pitch-feeding a carrier tape holding a component that is a mounting target is installed as the part feeder, is illustrated. Tape feeder 9 pitch-feeds the carrier tape storing component D in a tape feeding direction thereby supplying component D at a position at which a component is picked up by a mounting head of a component mounting mechanism which is described below. That is, tape feeder 9 is a component supplier for supplying component D.

In FIG. 3, Y-axis beam 10 having a linear drive mechanism is disposed at one end portion in the X direction on an upper surface of base 6 along the Y direction. Similarly, two X-axis beams 11 having linear drive mechanisms are coupled to Y-axis beam 10 to be movable in the Y direction. X-axis beams 11 are disposed along the X direction. Mounting heads 12 are respectively installed on two X-axis beams 11 to be movable in the X direction. As illustrated in FIG. 4, mounting head 12 has a plurality of suction units 12a which are capable of ascending and descending by sucking and holding component D. Suction nozzle 12b is provided at each tip of suction units 12a.

Y-axis beam 10 and X-axis beam 11 are driven and thereby mounting head 12 moves in the X direction and the Y direction. Therefore, two mounting heads 12 suck and pick up components D from the component pick-up position of tape feeder 9 disposed in corresponding component supplying units 8 (1) and 8(2) respectively using suction nozzles 12b, thereby mounting component D on a mounting point of board B positioned in board transport mechanism 7. Y-axis beam 10, X-axis beam 11, and mounting head 12 move mounting head 12 holding component D thereby configuring the component mounting mechanism which performs mounting of component D on board B.

The mounting time until component D is picked up from tape feeder 9 and is mounted on board B depends on a distance mounting head 12 moves from tape feeder 9 to the mounting point of board B. That is, the mounting time increases and decreases depending on the position of tape feeder 9. For example, it is possible to shorten the moving distance of mounting head 12 and reduce the mounting time by performing the component arrangement so that tape feeder 9 which supplies component D, of which the number of mountings on board B, is large is located near the center of component supplying units 8 (1) and 8(2).

In FIG. 3, component recognition camera 13 is disposed between component supplying unit 8 and board transport mechanism 7. When mounting head 12 which picks up a component from component supplying unit 8 moves above component recognition camera 13, component recognition camera 13 images component D of a state of being held in mounting head 12 and recognizes a holding posture of component D. Board recognition camera 14 is attached to plate 11a to which mounting head 12 is attached. Board recognition camera 14 integrally moves with mounting head 12.

As mounting head 12 moves, board recognition camera 14 moves to above board B positioned in board transport mechanism 7 and a board mark (not illustrated) provided on board B is imaged to recognize the position of board B. In a component mounting operation on board B by mounting head 12, a mounting position is corrected taking into account a recognition result of component D by component recognition camera 13 and a recognition result of the board position by board recognition camera 14.

In FIG. 4, component supplying units 8(1) and 8(2) are configured of component supply carriage 5 where the plurality of tape feeders 9 are installed on feeder base 5a in advance. Component supply carriage 5 is detachably configured with respect to base 6. Tape feeder 9 is installed on feeder base 5a so that the feeder controller built in tape feeder 9 is electrically connected to mounting controller 21 (see FIG. 5) of component mounters M3 to M6. Component supply carriage 5 holds reel 16 that stores carrier tape 15 in a state where carrier tape 15 is wound. Carrier tape 15 picked up from reel 16 is installed on tape feeder 9. Tape feeder 9 pitch-feeds carrier tape 15 to the component pick-up position using suction nozzle 12b.

As described above, component supply carriage 5, which can dispose the plurality of the component suppliers (tape feeders 9) for supplying component D, can be attached and detached to and from component mounter M3. As described above, in component mounter M3, board transport mechanism 7, the component mounting mechanism (Y-axis beam 10, X-axis beam 11, and mounting head 12), component recognition camera 13, and board recognition camera 14 configure component mounting work unit 17 (see FIG. 5) that mounts component D supplied by component supplying units 8(1) and 8(2) on transported board B by transporting board B.

Next, a configuration of a control system of component mounting system 1 will be described with reference to FIG. 5. Component mounting lines L1 to L3 included in component mounting system 1 have the same configuration and, hereinafter, component mounting line L1 will be described. Component mounters M3 to M6 included in component mounting line L1 have the same configuration and, hereinafter, component mounter M3 will be described.

Figure 5:
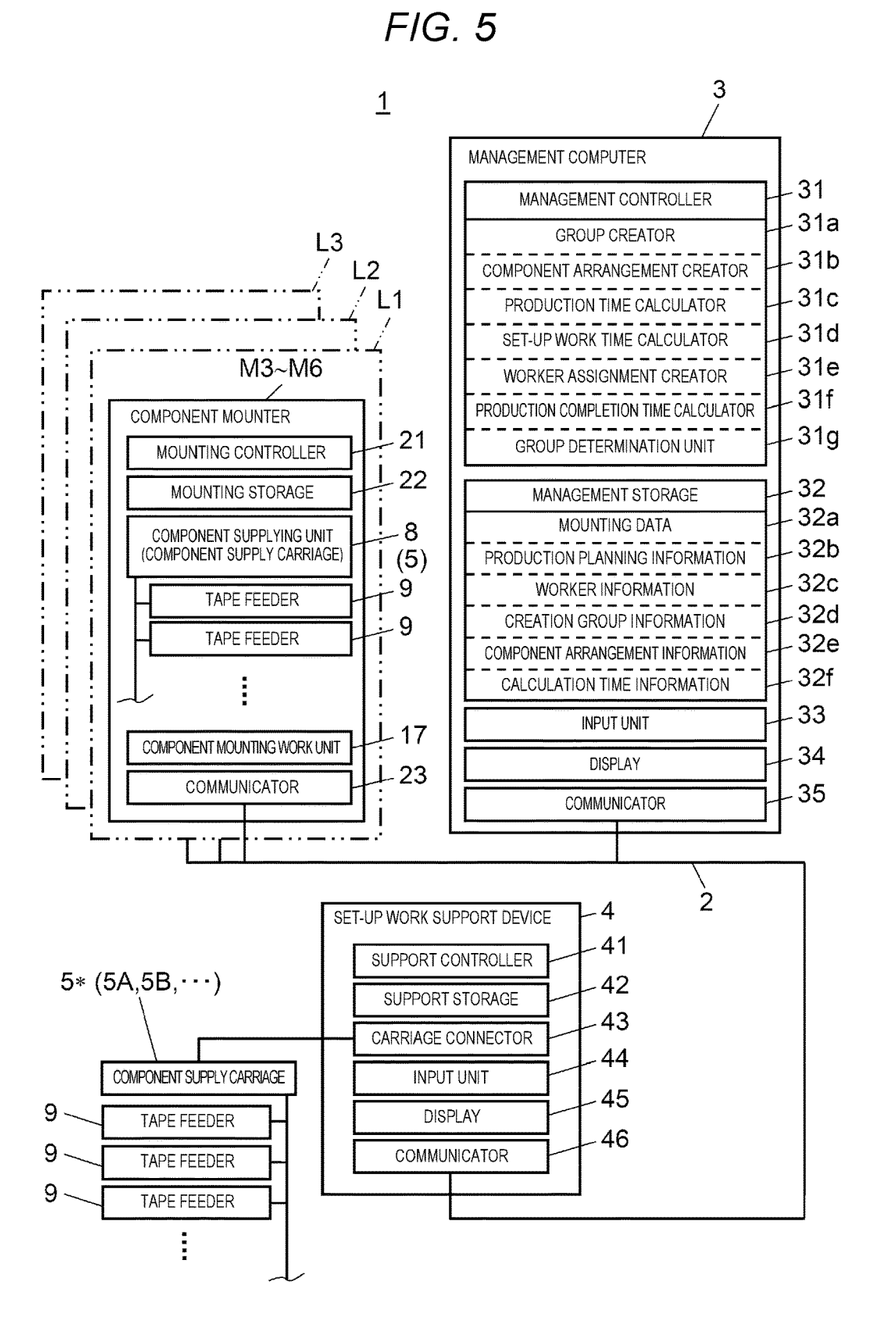
FIG. 5 is a block diagram illustrating a configuration of a control system of the component mounting system of an embodiment of the disclosure.

In FIG. 5, component mounter M3 has mounting controller 21, mounting storage 22, component supplying unit 8, component mounting work unit 17, and communicator 23. Communicator 23 is a communication interface and performs receiving and transmitting a signal or data between other component mounters M4 to M6, other component mounting lines L2 and L3, and management computer 3 via communication network 2. Mounting controller 21 executes the component mounting work by component mounter M3 by controlling tape feeder 9 installed on component supplying unit 8 and component mounting work unit 17 based on component mounting data stored in mounting storage 22.

In FIG. 5, management computer 3 has management controller 31, management storage 32, input unit 33, display 34, and communicator 35. Input unit 33 is an input device such as a keyboard, a touch panel, or a mouse, and is used when inputting an operation command or data. Display 34 is a display device such as a liquid crystal panel and displays various types of information of an operation screen for operation by input unit 33 and the like. Communicator 35 is a communication interface and performs receiving and transmitting a signal or data between component mounters M3 to M6 of component mounting lines L1 to L3 and set-up work support device 4 via communication network 2.

Management controller 31 is an arithmetic apparatus such as a CPU and manages component mounting system 1 based on information stored in management storage 32. Management controller 31 has group creator 31a, component arrangement creator 31b, production time calculator 31c, set-up work time calculator 31d, worker assignment creator 31e, production completion time calculator 31f, and group determination unit 31g as an internal processing function. Management storage 32 is a storage device and stores mounting data 32a, production planning information 32b, worker information 32c, creation group information 32d, component arrangement information 32e, calculation time information 32f, and the like.

In FIG. 5, mounting data 32a is data such as the type of the component of mounted component D or the mounting point in board B, and is stored for each mounting board V of the production target. Production planning information 32b stores a production plan including types of mounting boards V and the number of productions produced in component mounting lines L1 to L3, or the like which is planned for a predetermined period of time (for example, one day) in component mounting system 1. The number of workers who perform the set-up changing work including the internal set-up work such as replacement of a mask of solder printing apparatus M1 in component mounting lines L1 to L3 and replacement of tape feeder 9 installed on component mounters M3 to M6 are stored in worker information 32c for each production time (see FIG. 9).

Group creator 31a combines a plurality of types of mounting boards V that are the production targets in component mounting lines L1 to L3 based on mounting data 32a and production planning information 32b, creates a plurality of groups G of the common arrangement in which the arrangement (component arrangement) of tape feeder 9 (component supplier) is common in component mounters M3 to M6, and stores the plurality of groups G in management storage 32 as creation group information 32d. The component arrangement of each group G is not necessarily completely common among all mounting boards V, for example, the component arrangement of spare carriage 5* may be commonly arranged, and only a part of tape feeders 9 installed on component mounters M3 to M6 may be a partial the common arrangement in which only tape feeder 9 is replaced for the set-up changing work.

Component arrangement creator 31b creates the component arrangement for each group G in association with spare carriage 5* (component supply carriage 5) installed on component supplying units 8 of component mounters M3 to M6 included in component mounting lines L1 to L3 tape feeder 9 (component D) mounted on spare carriage 5* (component supply carriage 5) based on mounting data 32a and creation group information 32d, and stores the component arrangement in management storage 32 as component arrangement information 32e.

In FIG. 5, production time calculator 31c calculates production time Tv necessary when mounting board V of the number of productions planned in component mounting lines L1 to L3 in which tape feeder 9 (component D) is arranged according to the created component arrangement for each mounting board V based on mounting data 32a, production planning information 32b, and component arrangement information 32e, and stores production time Tv in management storage 32 as calculation time information 32f. That is, production time calculator 31c calculates production time Tv of mounting board V in group G created by group creator 31a.

Set-up work time calculator 31d calculates the external set-up work time Tw for the external set-up work and internal set-up work time Tc for the internal set-up work based on mounting data 32a, worker information 32c, creation group information 32d, and component arrangement information 32e, and stores external set-up work time Tw and internal set-up work time Tc in calculation time information 32f. That is, set-up work time calculator 31d has functions as the external set-up work calculator which calculates external set-up work time Tw for the external set-up work and the set-up changing work time calculator which calculates internal set-up work time Tc for the internal set-up work.

The external set-up work is work in which tape feeder 9 (component supplier) used in group G that is the next production target of group G in the production in component mounting lines L1 to L3 is arranged (installed) in component supply carriage 5 (spare carriage 5*) removed from component mounting lines L1 to L3 according to the component arrangement. In component mounting system 1 of the embodiment, the external set-up work is executed with respect to spare carriage 5* which is connected to set-up work support device 4 of external set-up area Ap.

The internal set-up work (set-up changing work) includes work for replacing component supply carriage 5 installed on component mounters M3 to M6 to spare carriage 5* (component supply carriage 5) in which tape feeder 9 used in group G that is the next production target by the external set-up work, work for replacing tape feeder 9 (component D) mounted on component mounters M3 to M6, and work for replacing the mask of solder printing apparatus M1.

In FIG. 5, worker assignment creator 31e creates assignment of the worker who performs the set-up changing work for changing mounting board V that is the production target in component mounting lines L1 to L3 based on internal set-up work time Tc included in worker information 32c and calculation time information 32f, updates, and stores worker information 32c. Production completion time calculator 31f calculates production completion time Tf at which the production of all mounting boards V that are the production target is calculated based on production time Tv, external set-up work time Tw, and internal set-up work time Tc (set-up changing work time) included in calculation time information 32f, and stores production completion time Tf in calculation time information 32f.

Group determination unit 31g repeatedly executes the creation of group G by group creator 31a, the calculation of production time Tv by production time calculator 31c, the calculation of external set-up work time Tw and internal set-up work time Tc by set-up work time calculator 31d, the creation of the worker assignment to component mounting lines L1 to L3 by worker assignment creator 31e, and the calculation of production completion time Tf by production completion time calculator 31f, and determines group G so that production completion time Tf is shortened in two component mounting lines L1 to L3 or more within a predetermined period.

In FIG. 5, set-up work support device 4 has support controller 41, support storage 42, carriage connector 43, input unit 44, display 45, and communicator 46. Input unit 44 is an input device such as a keyboard, a touch panel, or a mouse, and is used when inputting an operation command or data. Display 45 is a display device such as a liquid crystal panel and displays various screens such as an operation screen for operation by input unit 44 and various types of information such as a procedure of the set-up work and the progress status of the set-up work.

Communicator 46 is a communication interface and performs receiving and transmitting of a signal or data from/to management computer 3 via communication network 2. Support controller 41 is an arithmetic apparatus such as a CPU and controls set-up work support device 4 based on information stored in support storage 42. Support storage 42 is a storage device and stores the component arrangement, the set-up work procedure, or the like. Carriage connector 43 is connected to spare carriage 5* (component supply carriages 5A and 5B, or the like of FIG. 1). Carriage connector 43 communicates with a feeder controller built in each tape feeder 9 installed on component supply carriage 5 via component supply carriage 5.

The group determination method for dividing the plurality of types of mounting boards V that are production targets into the plurality of groups G in which the arrangement of component suppliers (tape feeders 9) is common in component mounters M3 to M6, in two component mounting lines L1 to L3 or more will be described with reference to FIG. 9 in accordance with the flows of FIGS. 6 to 8.

Here, an example, in which three types of mounting boards V1 to V3 are produced in component mounting line L1 and three types of mounting boards V4 to V6 are produced in component mounting line L2 illustrated in FIG. 9, will be described. For the sake of simplicity, it is assumed that the external set-up work for arranging the component on spare carriage 5* is completed before the set-up changing work for installing spare carriage 5* on component mounters M3 to M6. That is, external set-up work time Tw does not affect the group determination and explanation concerning the calculation of external set-up work time Tw will be omitted.

Figure 6:
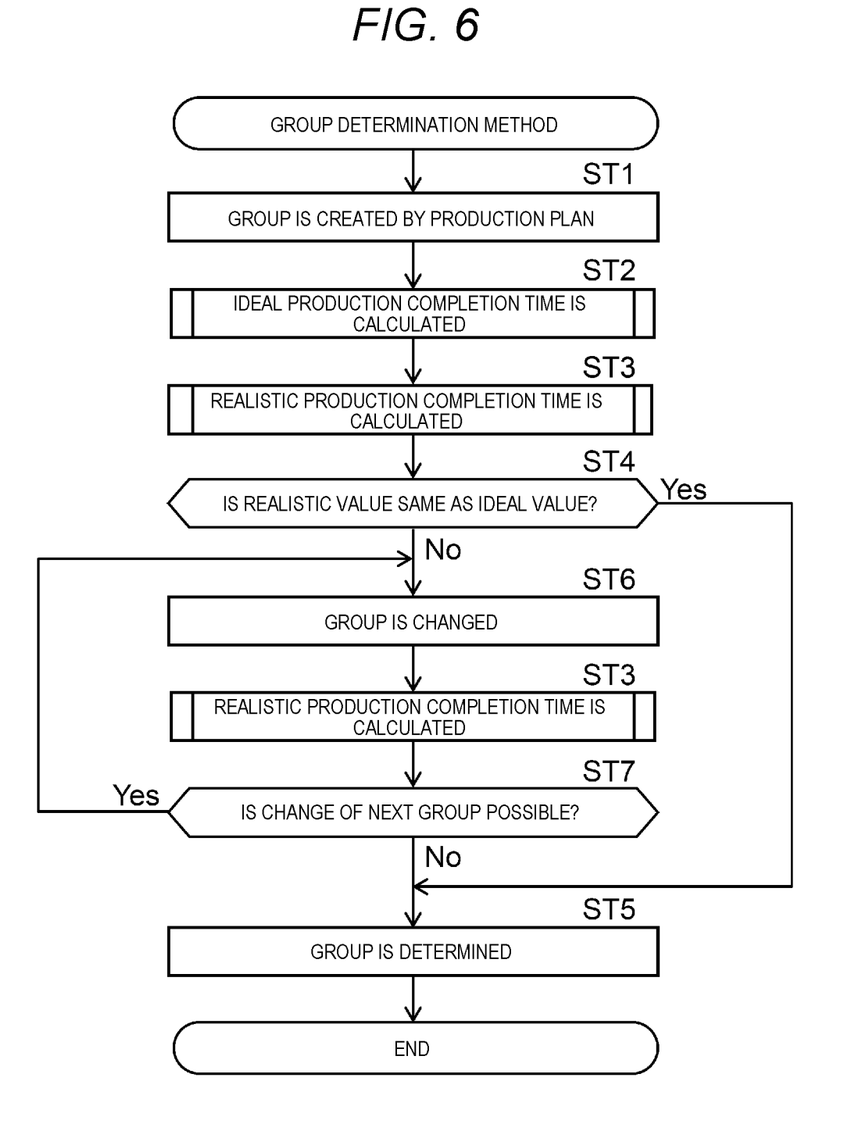
FIG. 6 is a flowchart of a group determination method in the component mounting system of an embodiment of the disclosure.

In FIG. 6, first, group creator 31a creates the plurality of groups G by combining the plurality of types of mounting boards V that are the production targets based on the production plan included in production planning information 32b (ST1: initial group creation step). Created group G is stored in creation group information 32d. In (a) of FIG. 9, initial groups G1 to G4 before the worker assignment are illustrated. In (a) of FIG. 9, mounting boards V1 and V2 are divided into group G1, mounting board V3 is divided into group G2, mounting boards V4 and V5 are divided into group G3, and mounting board V6 is divided into group G4.

In FIG. 6, next, ideal production completion time Tf0 is calculated (ST2: ideal production time calculation step). Here, among production completion time Tf at which the production of mounting boards V1 to V3 is completed in component mounting line L1 and production completion time Tf at which the production of mounting boards V4 to V6 is completed in component mounting line L2, later production completion time Tf is ideal production completion time Tf0.

Here, details of the ideal production time calculation step (ST2) will be described with reference to FIG. 7. First, component arrangement creator 31b creates the component arrangement corresponding to created group G1 to G4 for each of group G1 to G4 (ST21: component arrangement creation step). Next, production time calculator 31c calculates production times Tv1 to Tv6 of mounting boards V1 to V6 in the created component arrangement for each of mounting boards V1 to V6 (ST22: production time calculation step). In (a) of FIG. 9, all production times Tv1 to Tv6 are calculated as 50 minutes.

Figure 7:
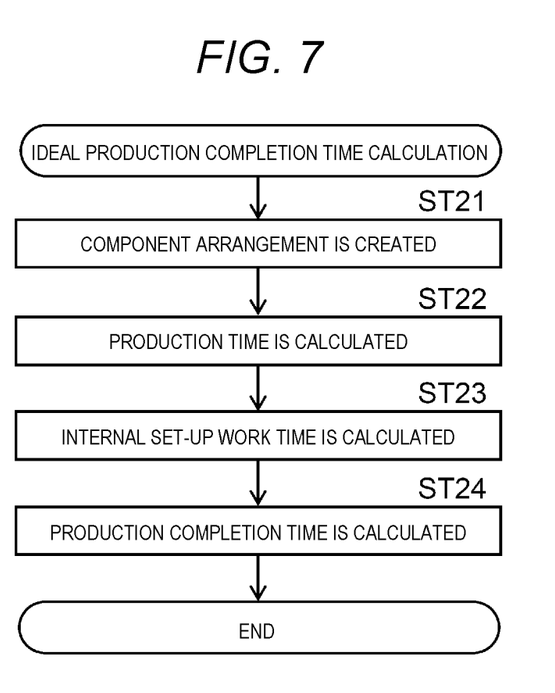
FIG. 7 is a flowchart of an ideal production completion time calculation in the component mounting system of an embodiment of the disclosure.

In FIG. 7, next, set-up work time calculator 31d calculates internal set-up work time Tc (ST24: internal set-up work time calculation step). At this time, internal set-up work time Tc is calculated on the assumption that each one worker is assigned to the set-up changing work in component mounting lines L1 and L2.

Figure 9:
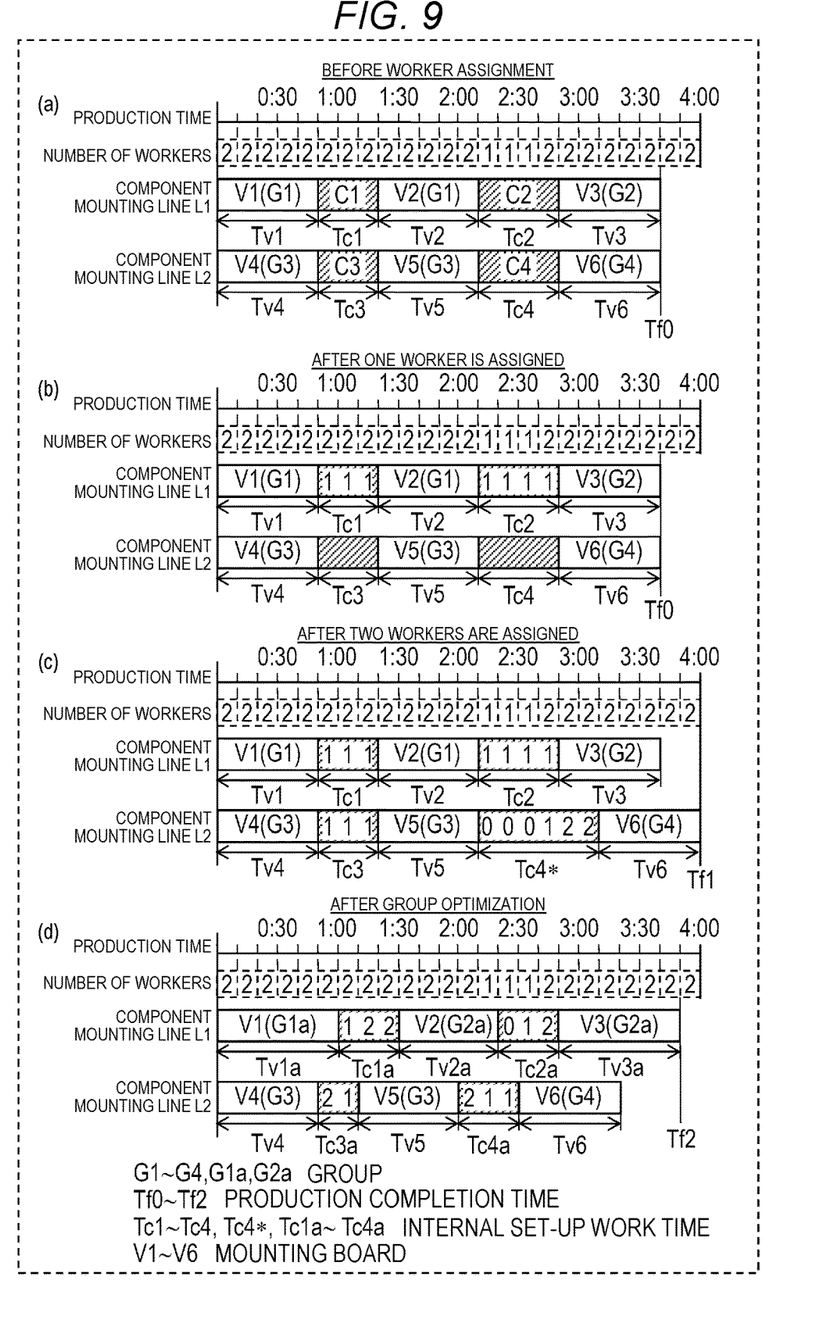
FIG. 9 is an explanatory view of the number of workers and a production time in the component mounting system of an embodiment of the disclosure.

In (a) of FIG. 9, internal set-up work time Tc1 of set-up changing work C1 from mounting board V1 to mounting board V2 in component mounting line L1 is calculated as 30 minutes and internal set-up work time Tc2 of set-up changing work C2 from mounting board V2 (group G1) to mounting board V3 (group G2) is calculated as 40 minutes. In addition, internal set-up work time Tc3 of set-up changing work C3 from mounting board V4 to mounting board V5 in component mounting line L2 is calculated as 30 minutes and internal set-up work time Tc4 of set-up changing work C4 from mounting board V5 (group G3) to mounting board V6 (group G4) is calculated as 40 minutes.

In FIG. 7, next, production completion time calculator 31f calculates ideal production completion time Tf0 based on production times Tv1 to Tv6 and internal set-up work times Tc1 to Tc4 (ST24: production completion time calculation step). In (a) of FIG. 9, production completion time Tf (Tv1+Tc1+Tv2+Tc2±Tv3) at which the production of mounting boards V1 to V3 in component mounting line L1, and production completion time Tf (Tv4+Tc3+Tv5+Tc4+Tv6) at which the production of mounting boards V4 to V6 in component mounting line L2 are all 3 hours and 40 minutes. Therefore, ideal production completion time Tf0 is calculated as 3 hours and 40 minutes. Calculated ideal production completion time Tf0 is stored in calculation time information 32f.

In FIG. 6, when the ideal production completion time calculation step (ST2) is completed, next, realistic production completion time Tf1 is calculated (ST3: realistic production time calculation step). Here, details of the realistic production time calculation step (ST3) will be described with reference to FIG. 8. In the realistic production completion time calculation (ST3), production completion time Tf1 is calculated in consideration of the number of workers actually capable of executing the set-up changing work in component mounting lines L1 and L2. Hereinafter, the same reference numerals are given to the same steps of the ideal production completion time (ST2) and detailed description will be omitted.

Figure 8:
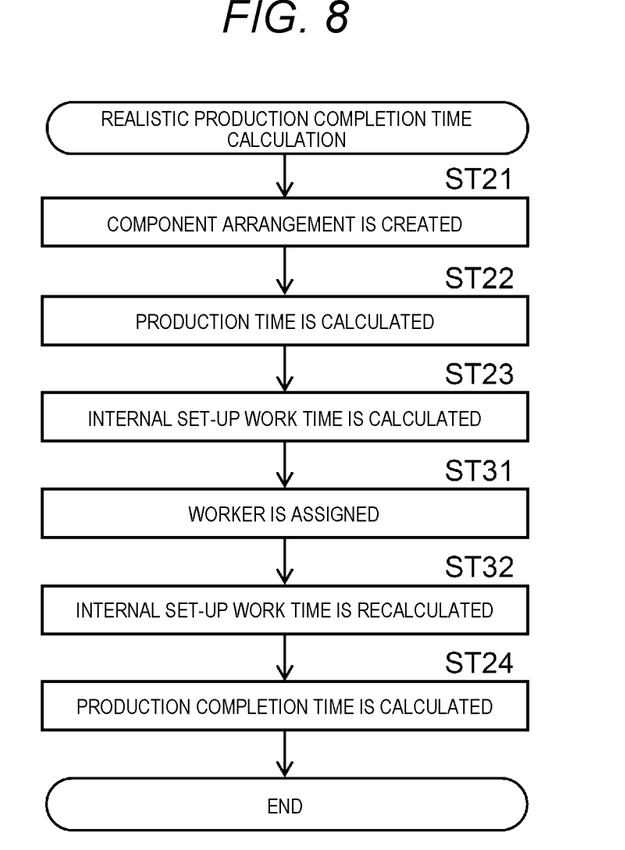
FIG. 8 is a flowchart of a realistic production completion time calculation in the component mounting system of an embodiment of the disclosure.

In FIG. 8, in the ideal production completion time calculation (ST3), first, the component arrangement creation step (ST21), the production time calculation step (ST22), and the internal set-up work time calculation step (ST23) are executed with respect to group G stored in creation group information 32d. At this time, since grouping is the same as that of the ideal production completion time calculation (ST2), the component arrangement creation step (ST21), the production time calculation step (ST22), and the internal set-up work time calculation step (ST23) may be omitted.

Next, worker assignment creator 31e creates the worker assignment in which the worker is assigned to each of set-up changing works C1 to C4 based on internal set-up work times Tc1 to Tc4 included in worker information 32c and calculation time information 32f (ST31: worker assignment creation step). In the example illustrated in FIG. 9, the number of workers is set at the production time every 10 minutes. Specifically, two workers are assigned from the production time 0: 00 to the production time 2: 10, one worker is assigned from the production time 2: 10 to the production time 2: 40, and two workers are assigned from the production time 2: 40 to the production time 4: 00 in component mounting lines L1 and L2.

In the worker assignment creation step (ST31), first, worker assignment creator 31e assigns one worker to set-up changing work C1 and set-up changing work C2 in component mounting line L1 ((b) of FIG. 9). Next, worker assignment creator 31e assigns one worker to set-up changing work C3 and set-up changing work C4 in component mounting line L2 ((c) of FIG. 9). Therefore, one worker is assigned to set-up changing work C3. However, since one worker is assigned to component mounting lines L1 and L2 from the production time 2: 10 to the production time 2: 40, and one worker is already assigned to set-up changing work C2, no worker can be assigned to set-up changing work C4 at this time.

Therefore, worker assignment creator 31e delays the start time of set-up changing work C4 and sets the production time 2: 40. Worker assignment creator 31e assigns one worker remaining from the production time 2: 40 to the production time 2: 50 in 10 minutes to set-up changing work C4. The number of man-hours necessary for set-up changing work C4 is 40 persons/minute and work of 30 persons/minute is left at the time point of the production time 2: 50. Therefore, worker assignment creator 31e assigns two workers who can be assigned in 20 minutes from the production time 2: 50 to the production time 3: 10.

In FIG. 8, set-up work time calculator 31d recalculates internal set-up work time Tc4* (set-up changing work time) according to the worker assignment illustrated in (c) of FIG. 9 (ST32: set-up changing work time calculation step). Therefore, internal set-up work time Tc4* of set-up changing work C4 is recalculated as 60 minutes including the time when the worker is not assigned. That is, in the set-up changing work time calculation step (ST32), internal set-up work time Tc4* (set-up changing work time) including the time when the worker necessary for the set-up change is not assigned is calculated.

As described above, in the set-up changing work time calculation step (ST32), internal set-up work times Tc1 to Tc3, and Tc4* (set-up changing work times) necessary for executing set-up changing works C1 to C4 for changing mounting boards V1 to V6 that are the production targets in component mounting lines L1 and L2 by set-up work time calculator 31d (set-up changing work time calculator) are calculated, based on the number of the workers assigned to the production in two component mounting lines L1 to L2 or more in each time zone, and the number of the workers necessary for set-up changing works C1 to C4 necessary when mounting boards V1 to V6 are changed in each of two component mounting lines L1 to L2 or more.

Next, the production completion time calculation step (ST24) is executed and realistic production completion time Tf1 is calculated by production completion time calculator 31f based on production times Tv1 to Tv2 and internal set-up work times Tc1 to Tc3, and Tc4*. That is, the production completion time calculation step (ST24), production completion time Tf1, which includes internal set-up work times Tc1 to Tc3, and Tc4* (set-up changing work times), and in which the production of all mounting boards V1 to V6 that are the production targets is completed, is calculated by production time calculator 31c.

In (c) of FIG. 9, production completion time Tf of component mounting line L1 is 3 hours and 40 minutes from ideal production completion time Tf0 without changed. However, production completion time Tf (Tv4+Tc3+Tv5+Tc4*+Tv6) of component mounting line L2 is 4 hours 00 minutes longer than ideal production completion time Tf0. Therefore, realistic production completion time Tf1 is calculated as 4 hours 00 minutes which is later. Calculated realistic production completion time Tf1 is stored in calculation time information 32f.

In FIG. 6, next, group determination unit 31g determines whether or not realistic production completion time Tf1 is the same as ideal production completion time Tf0 (ST4). If it is the same (Yes in ST4), group determination unit 31g determines the grouping as groups G1 to G4 in which ideal production completion time Tf0 is calculated (ST5: group determination step). In a case where realistic production completion time Tf1 is longer than ideal production completion time Tf0 (No in ST4), group optimization which is described later is executed.

In the group optimization, first, group creator 31a creates the grouping by changing mounting boards V1 to V6 included in any of groups G1 to G4 to other groups G1 to G4 ((ST6: group creation step). That is, the plurality of groups G, in which the plurality of types of mounting boards V that are the production targets are combined, are created. The created grouping is stored in creation group information 32d. Next, the realistic production completion time calculation step (ST3) which is described-above is executed and production completion time Tf2 is calculated in the created grouping.

Group determination unit 31g determines whether or not the change of next group G can be performed (ST7). In a case where the change can be performed (Yes in ST7), the procedure returns to the group creation step (ST6) to change the grouping and production completion time Tf is calculated. In a case where the possible group optimization is ended (No in ST6), the procedure proceeds to the group determination step (ST5) and group determination unit 31g determines the grouping as grouping with realistic production completion time Tf being the shortest.

As described above, in the group optimization, the group creation step (ST6) and the realistic production completion time calculation step (ST3) are repeated and group G is determined so that production completion time Tf is shortened in two component mounting lines L1 to L3 or more within a predetermined time period. Therefore, it is possible to determine group G of mounting board V in which the component arrangement having high productivity is common.

Examples of groups G1a, G2a, G3, and G4 which are optimized by the group optimization, and production completion time Tf2 are illustrated in (d) of FIG. 9. In the example, optimization is performed to change mounting board V1 to group G1a and change mounting board V2 and mounting board V3 to group G2a in component mounting line L1. In component mounting line L1 in which the component is arranged by the grouping, production time Tv1a of mounting board V1 is 60 minutes, and production time Tv3a of mounting board V3 is 60 minutes, which are respectively longer than before the group optimization. The number of man-hours of set-up changing work C1 is calculated as 50 persons/minute and the number of man-hours of set-up changing work C2 in the grouping is calculated as 30 persons/minute.

Production time Tv1a of mounting board V1 and production time Tv3a of mounting board V3 are lengthened, but since set-up changing work C1 of component mounting line L1 and set-up changing work C3 of component mounting line L2 are shifted from each other, internal set-up work time Tc3a is shortened. That is, two workers can be assigned from the production time 0: 50 to the production time 1: 00 of set-up changing work C3, and internal set-up work time Tc3a of set-up changing work C3 can be shortened to 20 minutes. Also in other set-up changing work C1, C2, and C4, since the time at which two workers can be assigned is increased, internal set-up work times Tc1a, Tc2a, Tc4a are shorter than before the group optimization ((c) of FIG. 9), or are increased or decreased.

In (d) of FIG. 9, the production completion time of component mounting line L2 is 3: 30 which is earlier than before the group optimization due to shortening of internal set-up work times Tc3a and Tc4a. On the other hand, in component mounting line L1, although internal set-up work time Tc2a is shortened, since production times Tv1a and Tv3a are lengthened, the production completion time is 3: 50 which is later than that in (c) of FIG. 9. However, production completion time Tf2 of two component mounting lines L1 and L2 is 3 hours 50 minutes which can be shorter than 4 hours 00 minutes of production completion time Tf1 before the group optimization.

In the group optimization of the embodiment, group G is determined under the condition that the order of the production of mounting boards V is not changed from the production plan, but the group optimization is not limited thereto. For example, the grouping may be determined by changing the production order of mounting boards V in a range in which the type and the production number of mounting boards V to be produced on a day so that production completion time Tf is shortened.

SUMMARY

As described above, the group determination method of the embodiment is a group determination method for dividing the plurality of types of mounting boards V that are production targets into the plurality of groups G in which the arrangement of the plurality of the component suppliers is common in the plurality of component mounters, in component mounting lines L1 and L2 each including the plurality of the component mounters capable of attaching and detaching component supply carriage 5, which can dispose the plurality of the component suppliers (tape feeders 9) for supplying components. The group determination method includes the set-up changing work time calculation step (ST32) of calculating the set-up changing work time necessary for executing the set-up changing work for changing the mounting boards V that are the production targets in component mounting lines L1 and L2, based on the number of workers assigned for production in component mounting lines L1 and L2 in each time zone, and the number of workers necessary for the set-up changing work necessary when the mounting board V is changed in each of component mounting lines L1 and L2; and the production completion time calculation step (ST24) of calculating production completion time Tf which includes the set-up changing work time and at which the production of all mounting boards V that are the production targets is completed. The plurality of groups G are determined so that the production completion time Tf is shortened within a predetermined time period in component mounting lines L1 and L2.

The group determination apparatus of the embodiment is a group determination apparatus which divides the plurality of types of mounting boards V that are production targets into the plurality of groups G in which the arrangement of the plurality of component supplier is common in the plurality of component mounters, component mounting lines L1 and L2 each including the plurality of the component mounters capable of attaching and detaching component supply carriage 5, which can dispose the plurality of the component suppliers (tape feeders 9) for supplying components are connected. The group determination apparatus includes set-up changing work time calculator 31d which calculates the set-up changing work time necessary for executing the set-up changing work for changing mounting boards V that are the production targets in component mounting lines L1 and L2, based on the number of the workers assigned for production in component mounting lines L1 and L2 in each time zone, and the number of the workers necessary for the set-up changing work necessary when mounting board V is changed in each of component mounting lines L1 and L2; production completion time calculator 31f which calculates production completion time Tf which includes the set-up changing work time and at which the production of all mounting boards V that are the production targets is completed; and group determination unit 31g which determines the plurality of groups G so that production completion time Tf is shortened within a predetermined time period in component mounting lines L1 and L2.

The group determination method and the group determination apparatus of the disclosure have an effect that it is possible to determine the group in which the common arrangement, which is capable of obtaining the productivity higher than that of the related art in the entire floor, is common, and are effective in a component mounting field in which a component is mounted on a board.

What is claimed is:
1. A method for dividing a plurality of types of mounting boards that are production targets into a plurality of groups of the mounting boards which are common in an arrangement of a plurality of component suppliers of a plurality of component mounters, in two component lines or more each including the plurality of the component mounters capable of attaching and detaching a component supply carriage, which can dispose the plurality of the component suppliers for supplying components, the method comprising:
 a set-up changing work time calculation step of calculating a set-up changing work time necessary for executing set-up changing work for changing the mounting boards that are the production targets in the two component mounting lines or more, based on the number of workers assigned for production in the two component mounting lines or more in each time zone, and the number of workers necessary for the set-up changing work necessary when the mounting board is changed in each of the two component mounting lines or more in the each time zone; and
 a production completion time calculation step of calculating a production completion time which includes the set-up changing work time and at which the production of all the mounting boards that are the production targets is completed,
 a group determining step of determining the plurality of the groups of the mounting boards so that the production completion time is shortened within a predetermined time period in the two component mounting lines or more; and
 a producing step of producing the plurality of types of the mounting boards in the two or more component mounting lines according to the determined groups.
2. The group determination method of claim 1,
 wherein in the set-up changing work time calculation step, the set-up changing work time also including a time at which the workers necessary for the set-up changing work is not assigned is calculated.

3. A apparatus which divides a plurality of types of mounting boards that are production targets into a plurality of groups of the mounting boards which are common in an arrangement of a plurality of component supplier of a plurality of component mounters, in two component mounting lines or more each including the plurality of the component mounters capable of attaching and detaching a component supply carriage, which can dispose the plurality of the component suppliers for supplying components, the apparatus comprising:

a set-up changing work time calculator which calculates a set-up changing work time necessary for executing set-up changing work for changing the mounting boards that are the production targets in the two component mounting lines or more, based on the number of workers assigned for production in the two component mounting lines or more in each time zone, and the number of workers necessary for the set-up changing work necessary when the mounting board is changed in each of the two component mounting lines or more in the each time zone;

a production completion time calculator which calculates a production completion time which includes the set-up changing work time and at which the production of all the mounting boards that are the production targets is completed; and a group determining unit which determines the plurality of the groups of the mounting boards so that the production completion time is shortened within a predetermined time period in the two component mounting lines or more; and the two or more component mounting lines producing the plurality of types of the mounting boards according to the determined groups.

4. The group determination apparatus of claim 3, wherein the set-up changing work time calculator calculates the set-up changing work time also including a time at which the workers necessary for the set-up changing work is not assigned.

* * * * *